US008120078B2

(12) United States Patent
Groiss

(10) Patent No.: US 8,120,078 B2
(45) Date of Patent: Feb. 21, 2012

(54) PHOTODIODE STRUCTURE

(75) Inventor: Stefan Hermann Groiss, Villach-Landskron (AT)

(73) Assignee: Infineon Technologies AG, Neubiberg (DE)

( * ) Notice: Subject to any disclaimer, the term of this patent is extended or adjusted under 35 U.S.C. 154(b) by 640 days.

(21) Appl. No.: 11/942,536

(22) Filed: Nov. 19, 2007

(65) Prior Publication Data
US 2009/0127597 A1    May 21, 2009

(51) Int. Cl.
  *H01L 27/144* (2006.01)
  *H01L 31/10* (2006.01)
  *H01L 21/04* (2006.01)
(52) U.S. Cl. .................. 257/292; 257/461; 257/E21.01; 257/E27.128; 438/48
(58) Field of Classification Search .................. 257/292, 257/461, E21.01, E27.128; 438/48
See application file for complete search history.

(56) References Cited

U.S. PATENT DOCUMENTS

| 2003/0173581 A1* | 9/2003 | Blanchard ..................... 257/183 |
| 2006/0223257 A1* | 10/2006 | Williams et al. .............. 438/202 |
| 2009/0315135 A1* | 12/2009 | Finkelstein et al. .......... 257/438 |

* cited by examiner

*Primary Examiner* — Cuong Q Nguyen
*Assistant Examiner* — Cathy N Lam
(74) *Attorney, Agent, or Firm* — Slater & Matsil, L.L.P.

(57) ABSTRACT

A photodiode structure including a semiconductor of a first conductivity type, the semiconductor having a main surface, a first well formed in the semiconductor at the main surface thereof, the first well being of a second conductivity type opposite to the first conductivity type. A second well formed in the semiconductor at the main surface thereof laterally outside the first well, the second well being of the second conductivity type, and a first terminal electrically connecting the first well and the second well, and a second terminal connecting the semiconductor such that a depletion region of laterally varying distance to the main surface results from applying a reverse voltage to the first and second terminals.

28 Claims, 7 Drawing Sheets

PHOTODIODE STRUCTURE

TECHNICAL FIELD

Embodiments of the present invention are related in general to the field of electronic systems and semiconductor devices, and more specifically to photodiodes fabricated in CMOS technology.

BACKGROUND

A photodiode is a semiconductor diode, having a pn-junction or p-i-n structure, that functions as a photodetector. A pn-junction is formed by combining p-type and n-type semiconductors together in very close contact, where p-type and n-type denote first and second conductivity types. A p-i-n structure is formed by placing an undoped intrinsic semiconductor region between p-type semiconductor and n-type semiconductor regions.

Typically, a photodiode image sensor includes a reset transistor and a light-sensing region formed by photodiodes. Each photodiode can be formed, e.g., by joining an n-doped region with a p-doped body. During operation, a voltage is applied to the gate terminal of the reset transistor such that the reset transistor is switched on and a capacitor at the pn-junction is charged up. When this capacitor is charged to a certain potential level, the reset transistor is switched off such that the photodiode is reverse biased, leading to the formation of a depletion region. When a photon of sufficient energy strikes the photodiode, it excites an electron thereby creating a mobile electron and a positively charged electron hole. If the absorption occurs in the pn-junction's depletion region, or one diffusion length away from it, these carriers are swept from the pn-junction by the built-in electric field of the depletion region, producing a photocurrent. That is, the electrons migrate towards the n-doped region such that the electric potential in the n-doped region will drop. On the other hand, the holes move away from the depletion region towards the p-doped body.

Typically, the pn-junction is located in a certain depth from a semiconductor main surface leading to a certain spectral selectivity of the photodiode structure. Light of short wavelength is attenuated more than light of a longer wavelength when entering the semiconductor through the main surface. Therefore, a photodiode can be made sensitive for short-wavelength light if the depletion region is formed in a depth close to the semiconductor surface and, on the other hand, a photodiode structure can be made sensitive to longer-wavelength light if the depletion region is arranged in a greater depth from the semiconductor main surface.

It would be desirable to have a photodiode structure fabricated in typical CMOS processing steps, which is sensitive to both light of short and longer wavelengths.

SUMMARY OF THE INVENTION

An embodiment of the present invention provides a photodiode structure comprising a semiconductor of a first conductivity type, the semiconductor having a main surface, a first well formed in the semiconductor at the main surface thereof, the first well being of a second conductivity type opposite to the first conductivity type, a second well formed in the semiconductor at the main surface thereof laterally outside the first well, the second well being of the second conductivity type, and a first terminal electrically connecting the first well and the second well, and a second terminal connecting the semiconductor such that a depletion region of laterally varying distance to the main surface results from applying a reverse voltage to the first and second terminals.

A further embodiment of the present invention provides a semiconductor device comprising a semiconductor layer of a first conductivity type, the semiconductor layer having a main surface, a photodiode structure formed in the semiconductor layer, the photodiode structure comprising a plurality of first wells formed in the semiconductor layer at the main surface thereof, the first wells being of a second conductivity type opposite to the first conductivity type, and regions of the second conductivity type having a higher dopant concentration than the first wells, the regions being formed in the semiconductor layer at the main surface thereof between the first wells, and an integrated circuit formed in the semiconductor layer laterally outside the photodiode structure, the integrated circuit comprising transistors comprising wells of the second conductivity type formed on the semiconductor layer in the same process steps as the first wells.

Yet a further embodiment of the present invention provides a method for fabricating a photodiode structure in a process flow according to CMOS technology materials, dimensions and process steps, the method comprising providing a semiconductor of a first conductivity type, the semiconductor having a main surface, forming a first well in the semiconductor at the main surface thereof, the first well being of a second conductivity type opposite to the first conductivity type, forming a region of the second conductivity type having a higher dopant concentration than the first well, the region being formed in the semiconductor at the main surface thereof laterally outside the first well, and connecting a first terminal to the first well and the region and connecting a second terminal to the semiconductor such that a depletion region of laterally varying distance to the main surface results from applying a reverse voltage to the first and second terminals.

Yet a further embodiment of the present invention provides a method for fabricating a semiconductor device in a process flow according to CMOS technology materials, dimensions and process steps, the method comprising forming a photodiode structure in a semiconductor layer of a first conductivity type, the semiconductor layer having a main surface, the photodiode structure comprising a plurality of first wells formed in the semiconductor layer at the main surface thereof, the first wells being of a second conductivity type opposite to the first conductivity type, and regions of the second conductivity type having a higher dopant concentration than the first wells, the regions being formed in the semiconductor layer at the main surface thereof between the first wells, and forming an integrated circuit in the semiconductor layer laterally outside the photodiode structure, the integrated circuit comprising transistors comprising second wells of the second conductivity type, wherein the steps of forming the photodiode structure and the integrated circuit both comprise a common doping step for the first and second wells.

BRIEF DESCRIPTION OF THE DRAWINGS

In the following, embodiments of the present invention are explained in more detail with reference to the accompanying drawings, in which.

DETAILED DESCRIPTION OF ILLUSTRATIVE EMBODIMENTS

Figure 1:
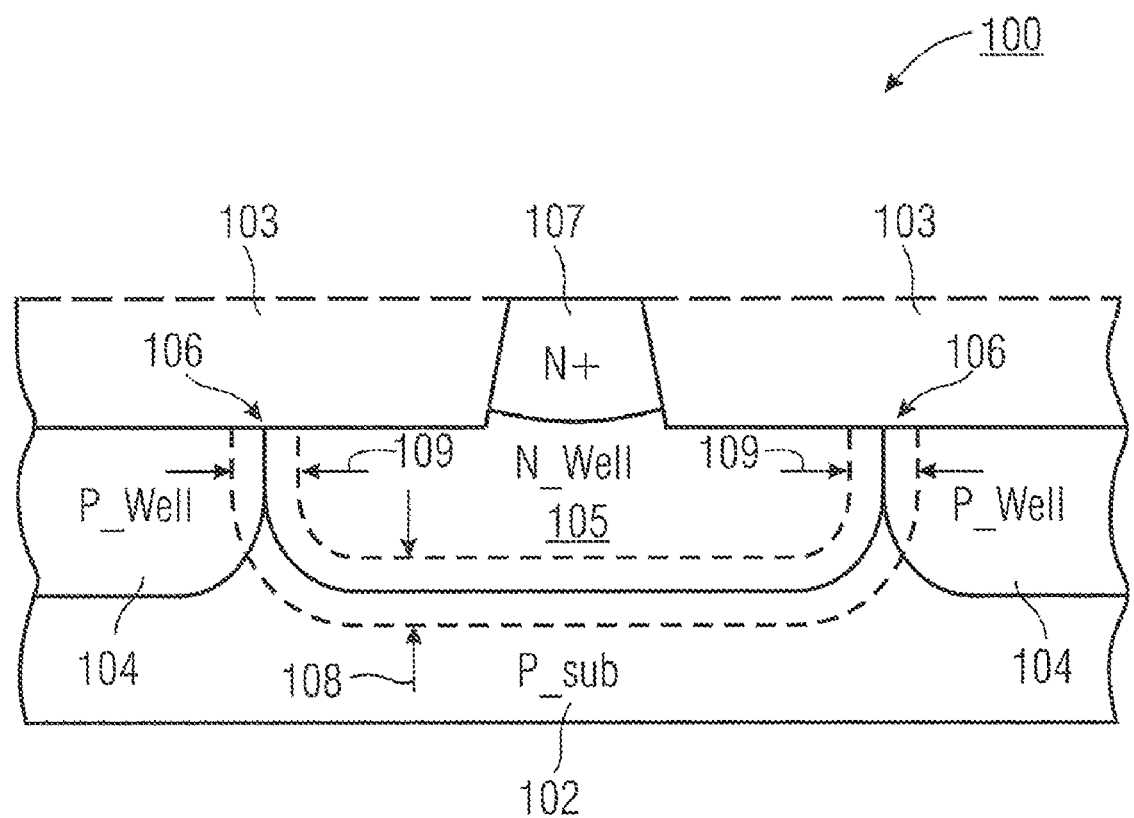
FIG. 1 shows a schematic cross-section of a typical photodiode in CMOS technology.

With regard to the following description, it should be noted that in the different embodiments, equal or equally operating functional elements have the same reference numerals and thus the descriptions of those functional elements are exchangeable in the different embodiments illustrated in the following.

Before describing embodiments of the present invention referring to FIGS. 2 to 7, shortcomings of known technology shall firstly be highlighted referring to FIG. 1.

FIG. 1 shows a cross-section of a photodiode structure fabricated in CMOS technology. The photodiode structure, generally designated 100, uses a silicon substrate 102 of a first conductivity type. In the following the first conductivity type is p-type although it could also be n-type. An insulating layer 103 of shallow trench isolation (STI) protects the main surface of the p-type substrate 102. Into the p-type substrate 102 has been fabricated a p-well 104, which surrounds a well 105 of a second conductivity type, the second conductivity type being n-type. The junctions between p-well 104 and n-well 105 intersect the main surface, protected by the insulating layer 103, along line 106. A heavily n-doped region 107, having a higher dopant concentration than the n-well 105, enables electrical contact to n-well 105.

When electrical reverse bias is applied to the photodiode structure 100 depletion regions are formed at the pn-junctions. In FIG. 1, one of these depletion regions 108 is schematically indicated at the n-well/p-substrate junction. As described before, incident light generates carriers mostly inside a depletion region of a photodiode's pn-junction. These carriers are in the form of electron hole pairs, which react to the influence of the electric field in the depletion region. Generated electrons are swept in the negative electrical field direction, the holes in the opposite direction. For a given incident light (wavelength, amplitude), the wider the depletion region, the more carriers the photodiode can collect, thus the better the spectral sensitivity of the photodiode.

FIG. 1 indicates that a substantial part of the depletion region 108 is located in a predefined depth below the main surface of the semiconductor substrate 102. This leads to a spectral selectivity of the semiconductor structure 100, since only light of a predefined wavelength corresponding to the depth of the depletion region 108 is reaching the latter.

In order to obtain a better spectral response compared to conventional photodiode structures as depicted in FIG. 1, the depletion region 108, for example, has to be vertically extended in a direction of the main surface of the semiconductor substrate 102. This can be achieved with photodiode structures according to embodiments of the present invention, which will be described in the following referring to FIGS. 2 to 7.

Figure 2:
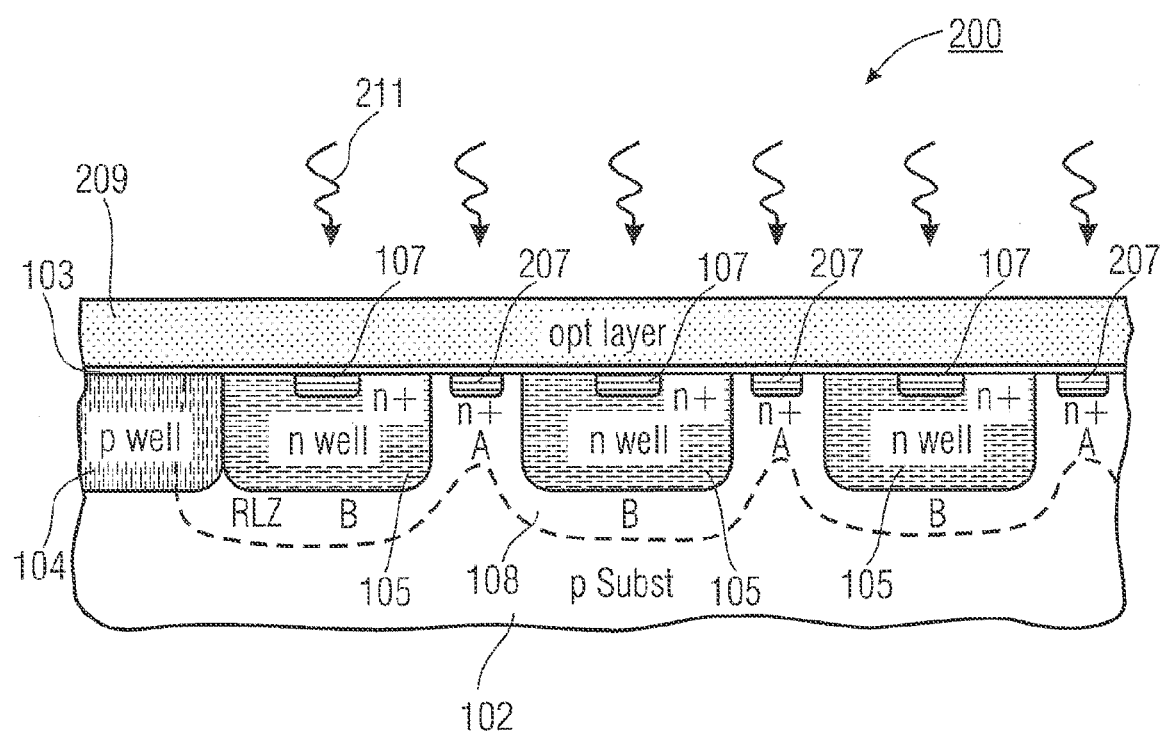
FIG. 2 shows a schematic cross-section of a photodiode structure according to an embodiment of the present invention.

FIG. 2 shows a schematic cross-section of a monolithic photodiode structure 200 according to an embodiment of the present invention.

The photodiode structure 200 comprises a semiconductor or a semiconductor substrate 102 of the first conductivity type (p-type), wherein the semiconductor 102 has a main surface being protected by an insulating layer 103. First wells 105 are formed in the semiconductor 102 at the main surface thereof, the first wells 105 being of the second conductivity type (n-type) opposite to the first conductivity type. Further, the photodiode structure 200 comprises regions 207 of the second conductivity type having a higher dopant concentration than the first wells 105, also being denoted as n-wells, the regions 207 being formed in the semiconductor 102 at the main surface thereof laterally outside the n-wells 105.

Each of the n-wells 105 comprises a sub-region 107 with a higher dopant concentration than the n-wells 105, the sub-regions 107 being formed with the n-wells 105 at the main surface of the semiconductor 102. According to the example given in FIG. 2, the sub-regions 107 are heavily n-doped regions to enable electrical contact to the n-wells 105.

According to an embodiment of the present invention, the heavily n-doped regions 207 are located between or are surrounded by two adjacent n-wells 105, respectively.

According to embodiments, the heavily n-doped sub-regions 107, 207 are electrically connected to a first terminal (not shown) and the semiconductor substrate 102 is electrically connected to a second terminal (not shown). When electrical reverse bias is applied to the photodiode structure 200 via the two terminals depletion regions are formed at the pn-junctions between the n-wells 105 and the substrate 102 and between the heavily n-doped regions 207 and the substrate 102. Due to a varying depth of the n-wells 105 and the heavily n-doped regions 207 the depletion region 108 has a laterally varying distance to the main surface.

Figure 3:
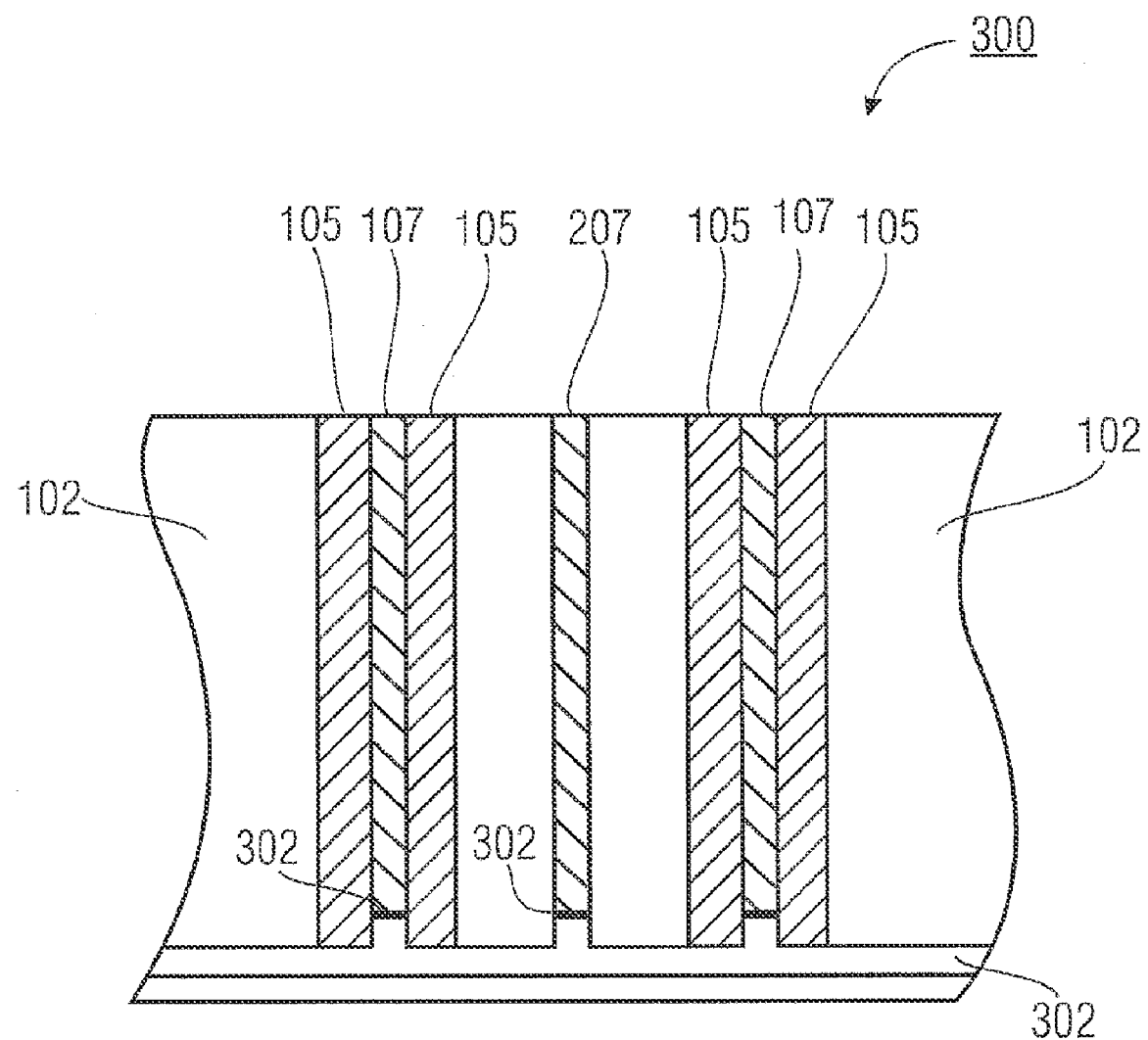
FIG. 3 shows a top view of the photodiode structure of FIG. 2.

For a better understanding of the electrical contacting of the heavily n-doped regions 107, 207 in the p-substrate 102, FIG. 3 shows a top view of a photodiode structure 300 according to an embodiment of the present invention.

In FIG. 3, a top view of two adjacent n-wells 105 with heavily n-doped sub-regions 107 for contacting a first terminal 302 can be identified. The two adjacent n-wells 105 surround a heavily n-doped region 207 also being electrically contacted to the first terminal 302. The semiconductor substrate 102 is connected to a second terminal at the bottom of the structure 300, wherein the second terminal not shown in FIG. 3.

Referring back to FIG. 2, the photodiode structure 200 comprising the n-wells 105 and the heavily n-doped regions 207 can be separated from a laterally neighboring circuitry, such as for example a signal-processing circuitry, by p-wells 104. According to embodiments of the present invention, the photodiode structure 200 is fabricated in a process flow according to CMOS technology materials, dimensions and process steps.

Hence, the n-wells 105 are provided by a standard CMOS process. The n-wells 105 are electrically connected via the heavily n-doped sub-regions 107, which, in a standard CMOS process, form, e.g., drain or source contacts for MOS transistors. As can be seen from FIG. 2, the n-wells 105 do not touch or overlap. In the space in between the n-wells 105, the heavily n-doped regions 207 are arranged. In a 0.25 micrometer (μm) CMOS process, the n-wells 105 vertically extend, e.g., about 1.1 micrometers below the main surface of the semiconductor 102. In other embodiments the n-wells 105 vertically extend from the main surface to a depth between about 0.1 micrometers and about 2.0 micrometers. Even depths outside that range are possible. The heavily n-doped regions 107, 207 vertically extend, e.g., about 0.2 micrometers below the main surface, respectively. In other embodiments the n-doped regions 107, 207 vertically extend from the main surface to a depth between 0.05 micrometers and 0.5 micrometers. Other vertical extension are, of course, possible and dependant on the used technology. A relation between the depths of the n-wells 105 and the n-doped regions 107, 207 lies in the range from about 3 to about 8, i.e., the depth of the n-wells 105 is about 3- to 8-times larger than the depth of the n-doped regions 107, 207. The p-wells 104 form boundaries of the photodiode structure 200 towards laterally neighboring circuitry, e.g., comprising MOS transistors with n-wells 105 and sub-regions 107.

A shallow oxide layer 103 (shown in FIG. 4) is placed over the n-wells 105 and the heavily n-doped regions 107, 207 on the main surface of the semiconductor. On top of the insulation layer 103, an optional specific optical layer 209 can be placed according to embodiments of the present invention. Such an optical layer 209 could be, for example, a color filter being transparent only for predetermined wavelengths or it could be a layer to avoid losses due to an unfortunate reflection factor.

The depletion region 108 reaches from the heavily n-doped regions 207 formed at the main surface of the semiconductor 102 (region A) to a region B below the n-wells 105, which reach deeper under the main surface compared to the heavily n-doped regions 107. The width of the depletion region 108 is dependent on the reverse voltage of the photodiode structure. However, qualitatively it will always have an extension as indicated in FIG. 2.

Incident light 211 (shown in FIG. 2) having different wavelengths is filtered, according to embodiments of the present invention, by the aforementioned optical filter layer 209. The optical filter layer 209 is, however, not essential for the extension of the spectral sensitivity of the photodiode structure 200. The vertical extension of the insulation layer 103 is typically very small compared to the wavelength of the incident light 211. For this reason, the insulation layer 103 will not cause a considerable optical effect.

Depending on the wavelength, the incident light 211 will propagate more or less into the photodiode structure 200. Due to physical properties of the photodiode structure 200, short wavelengths (e.g., ultraviolet to blue in a wavelength region from about 300 nanometers to about 350 nanometers) only have a very small penetration depth. Light with longer wavelengths (e.g., red to infrared in a wavelength region from about 600 nanometers to about 800 nanometers) has a larger penetration depth into the photodiode structure 200.

If the photodiode structure 200 was formed by a laterally continuous n-doped layer formed on a p-doped layer, the depletion region 108 would have a smaller vertical extension, as has been shown in FIG. 1. In this case, only electron hole pairs having been generated by a strongly limited wavelength range would contribute to the photocurrent, since the depletion region 108 would lie in a predetermined depth from the main surface and would be reached only by a limited wavelength region due to the wavelength-dependent penetration depth of the incident light 211.

Embodiments of the present invention are however built such that the depletion region 108 vertically extends from the main surface (region A) to a region B under the n-wells 105. This ensures that incident light 211 light of short wavelength, which generates electron hole pairs within a small penetration depth from the main surface, as well as incident light 211 light of long wavelength, which propagates to a depth below the n-wells 105, contribute to the photo current.

According to the embodiment depicted in FIG. 2, the heavily n-doped regions 207 are formed within the p-type substrate 102.

Figure 4:
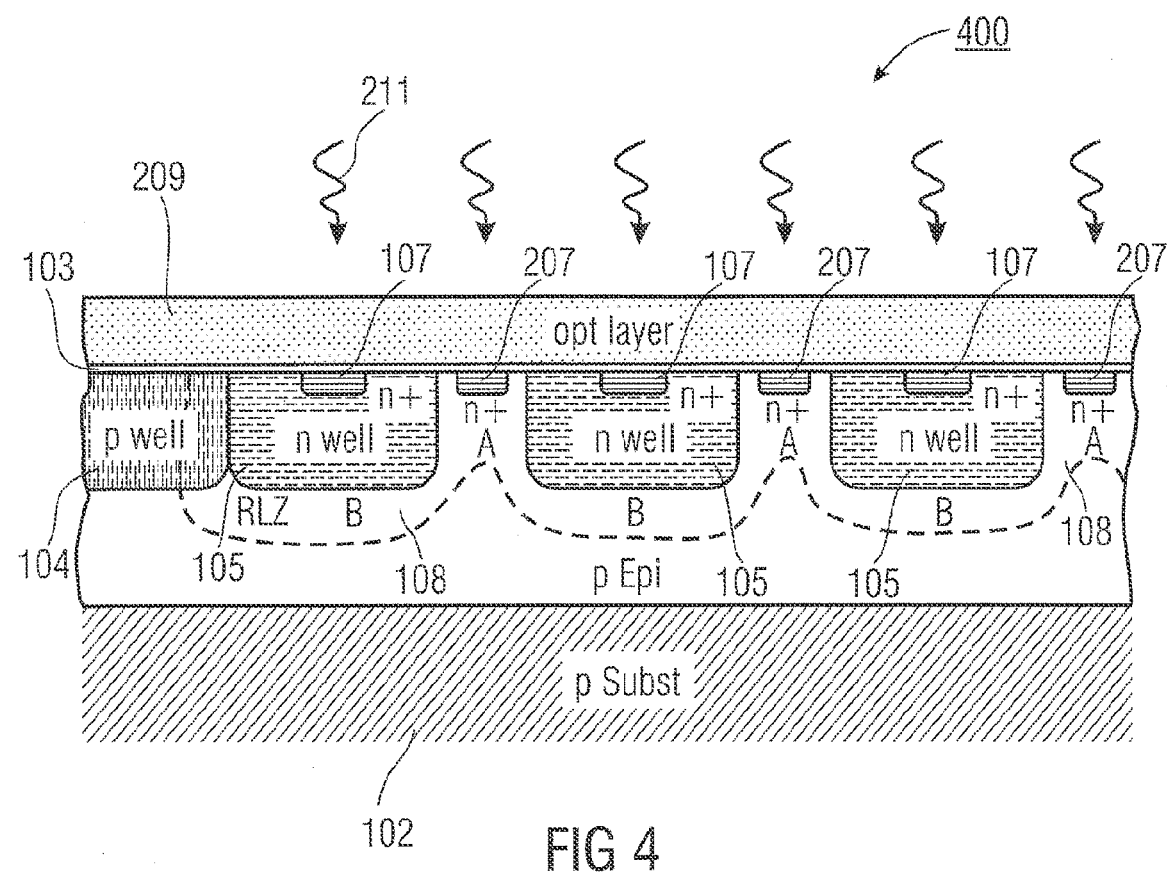
FIG. 4 shows a schematic cross-section of a photodiode structure according to a further embodiment of the present invention.

According to further embodiments of the present invention, the n-wells 105 and the heavily n-doped regions 207 could also be formed within a p-type epitaxial layer 402 formed on the p-type semiconductor substrate 102, as shown in FIG. 4.

Figure 5:
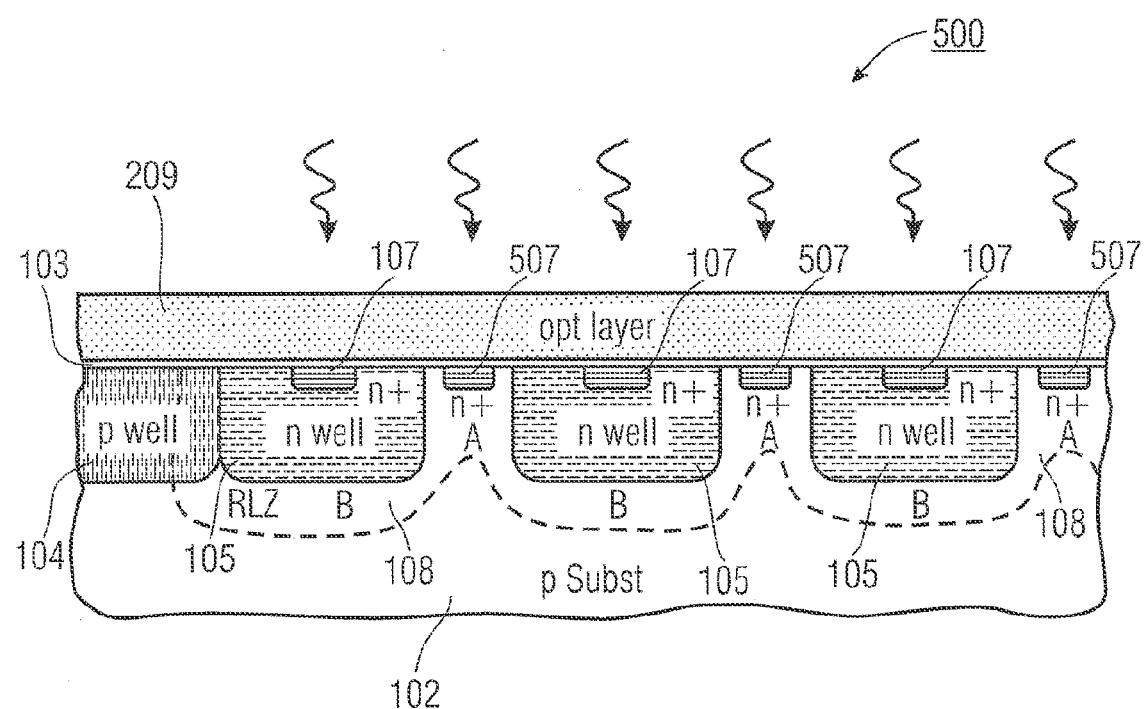
FIG. 5 shows a schematic cross-section of a photodiode structure of yet a further embodiment of the present invention.

Yet a further embodiment of the present invention is shown in FIG. 5.

The functionality of the semiconductor structure 500 is basically the same as the functionality of the semiconductor structure of FIG. 2. The vertical extension of the depletion region 108 up to the main surface of the p-substrate 102 is stopped by a laterally wider, heavily n-doped region 507 resulting in a decreased spectral sensitivity for shorter wavelengths compared to the embodiment of the present invention described with respect to FIG. 2. In contrast, the spectral sensitivity maximum is slightly shifted to higher wavelengths.

Figure 6:
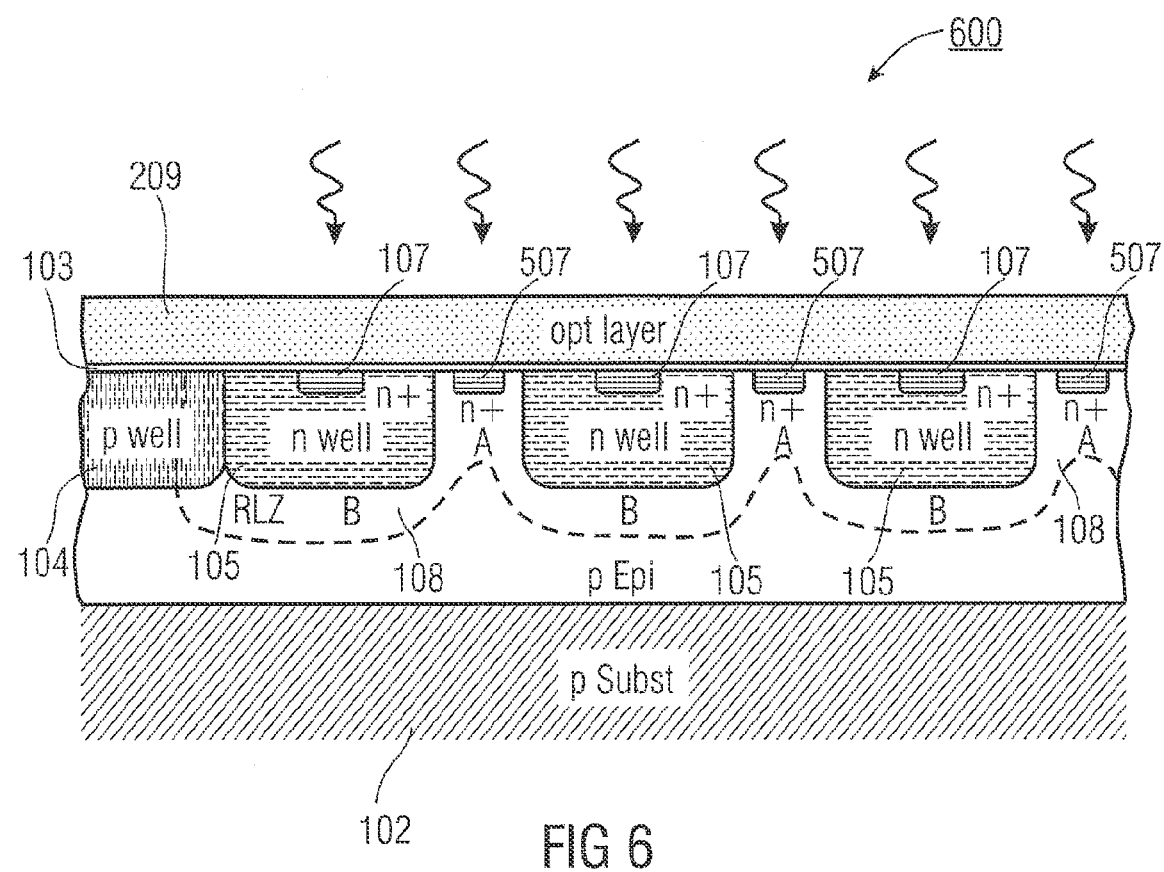
FIG. 6 shows a schematic cross-section of yet a further embodiment of the present invention.

A further embodiment of the present invention is depicted in FIG. 6, wherein the p-substrate 102 is replaced by an epitaxial layer 402 formed on top of the p-substrate 102.

As can be seen from the different embodiments of the present invention described before, the lateral width of the heavily n-doped regions 207 can vary in a range from 0 to the distance between two adjacent n-wells 105. The distances between the n-wells 105 and the distances of the n-wells 105 and the heavily n-doped regions 207 depend on the dopant concentrations and the reverse voltage over the photodiode structure. Typically, the regions 107, 207 are heavily doped, wherein the n-wells 105 have a smaller dopant concentration. The p-type substrate 102 has an even smaller dopant concentration. As a result, the depletion region 108 will extend more into the p-substrate 102. The distance between two adjacent n-wells 105 can be dimensioned in such a way that the depletion regions touch each other at the main surface at a given reverse voltage.

For a 0.25 µm CMOS process the following relationships between the reverse voltage over the photodiode structure and the distances between the n-wells 105 hold. For a reverse voltage of about 0 V the distance between the n-wells 105 can be chosen to about 0.6 µm or, vice versa, for a distance of about 0.6 µm between the n-wells 105 a reverse voltage of about 0 V can be chosen. For a reverse voltage of about 0.5 V the distance between the n-wells 105 can be chosen to about 0.8 µm. For a reverse voltage of about 1.0 V the distance between the n-wells 105 can be chosen to about 0.9 µm. For a reverse voltage of about 1.5 V the distance between the n-wells 105 can be chosen to about 1.0 µm. For a reverse voltage of about 2.0 V the distance between the n-wells 105 can be chosen to about 1.2 µm. For a reverse voltage of about 2.5 V the distance between the n-wells 105 can be chosen to about 1.3 µm.

Figure 7:
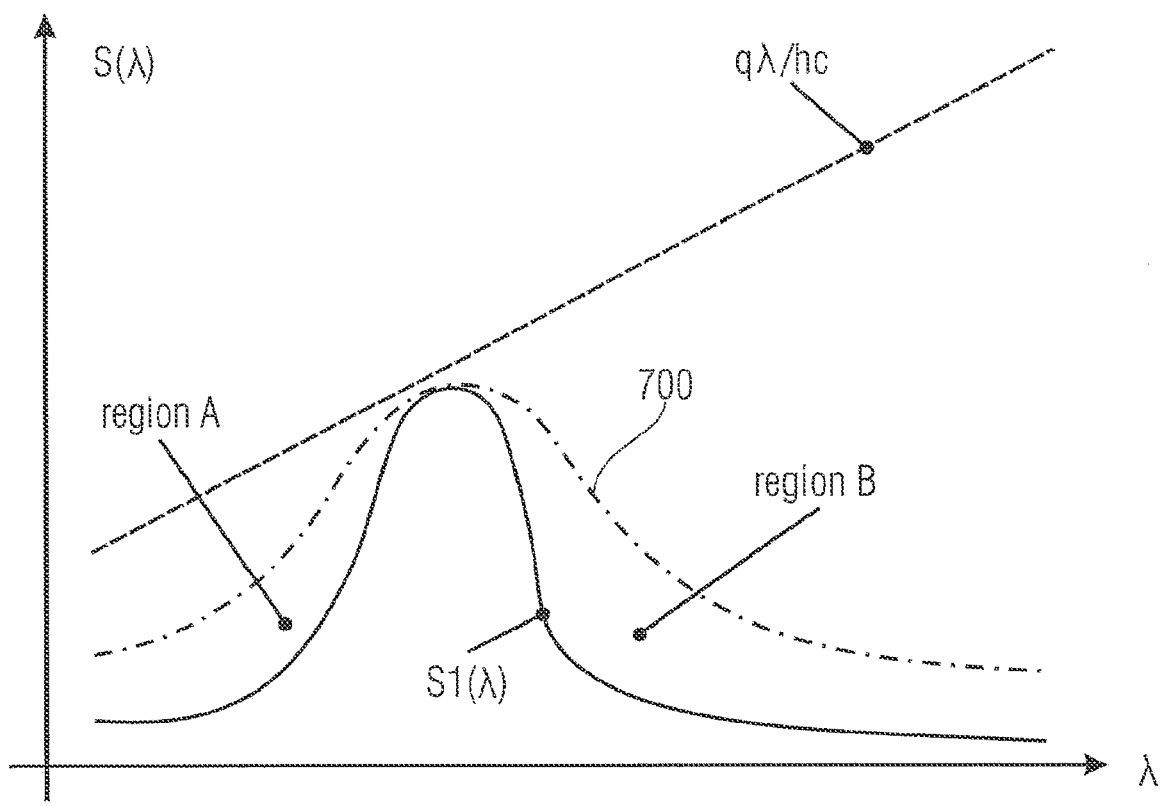
FIG. 7 shows a wavelength-dependent sensitivity of a typical photodiode structure and a photodiode structure according to embodiments of the present invention.

The extended spectral sensitivity of photodiode structures according to embodiments of the present invention is graphically depicted in FIG. 7.

In FIG. 7, the straight line $q\lambda/hc$ represents the theoretical boundary of the optical sensitivity $S(\lambda)$, wherein q represents the elementary charge, $\lambda$ the wavelength, h represents the Planck constant and c represents the speed of light. $S1(\lambda)$ denotes the spectral sensitivity of a conventional photodiode structure with a laterally continuous n-layer being spectrally sensitive for only a rather small wavelength region, as described with respect to FIG. 1. Curve 700 depicts the spectral sensitivity of a photodiode structure according to embodiments of the present invention.

Since embodiments of the present invention provide a depletion region 108 extending from the main surface to a region below the n-wells 105, additional spectral contributions to the photocurrent result. Contributions of the region A of the depletion region 108 relate to short wavelengths, since the region A of the depletion region 108 is placed closely under the main surface. Contributions of region B relate to longer wavelengths, since region B is placed relatively deeply under the main surface of the semiconductor under the n-wells 105. Hence, embodiments of the present invention provide a spectrally extended sensitivity compared to photodiode structures with vertically continuous n-doped layers.

Although within the above embodiments, the n-doped regions 207 have been depicted as being formed in the semiconductor at the main surface thereof, different embodiments are also possible. For example, the regions 207 may be buried in to the semiconductor with, for example, a via structure connecting the buried region with a common terminal interconnecting the buried region as well as wells 105.

While this invention has been described in terms of several preferred embodiments, there are alterations, permutations, and equivalents, which falls within the scope of this invention. It should be also noted that there are many alternative ways of implementing the methods and compositions of the present invention. For example, n-wells could be replaced by p-wells, heavily n-doped regions could be replaced by heavily p-doped regions, p-type epitaxial layers could be replaced by n-type epitaxial layers and p-substrates could be replaced by n-substrates. It is therefore intended that the following appended claims be interpreted as including all such alterations, permutations and equivalents as fall within the true spirit and scope of the present invention.

What is claimed is:

1. A photodiode structure comprising:
   a semiconductor of a first conductivity type, the semiconductor having a main surface;
   a first well formed in the semiconductor at the main surface, the first well being of a second conductivity type opposite to the first conductivity type;
   a second well formed in the semiconductor at the main surface laterally outside the first well, the second well being of the second conductivity type;
   a first terminal electrically connected to the first well and the second well;
   a second terminal electrically connected to the semiconductor such that a depletion region of laterally varying distance to the main surface results from applying a reverse voltage to the first and second terminals; and
   an optically transmissive layer overlaying the first and second wells so that the first and second wells receive light incident onto the photodiode structure such that a depletion region associated with both wells contributes to a photocurrent generated by the photodiode structure.

2. The photodiode structure according to claim 1, further comprising a region of the second conductivity type having a higher dopant concentration than the first and second wells, the region of the second conductivity type being formed in the semiconductor laterally between the first and second wells.

3. The photodiode structure according to claim 2, wherein the first terminal electrically connects the first and second well and the region of the second conductivity type between the first and second well.

4. The photodiode structure according to claim 1, wherein the semiconductor comprises an epitaxial layer formed on a semiconductor substrate.

5. The photodiode structure according to claim 2, wherein the region of second conductivity type extends from the first well to the second well.

6. The photodiode structure according to claim 2, wherein the region of second conductivity type is spaced from both the first and second well regions.

7. The photodiode structure according to claim 1, comprising an optical filter layer or an antireflection layer covering the first well and the second well.

8. A semiconductor device comprising:
   a semiconductor layer of a first conductivity type, the semiconductor layer having a main surface;
   a photodiode structure disposed in the semiconductor layer, the photodiode structure comprising a plurality of first wells disposed in the semiconductor layer at the main surface thereof, the first wells being of a second conductivity type opposite to the first conductivity type, the photodiode structure further comprising at least one region of the second conductivity type having a higher dopant concentration than the first wells, the at least one region of the second conductivity type being formed in the semiconductor layer between the first wells, wherein the region of the second conductivity type forms a pn junction with the semiconductor layer of the first conductivity type; and
   integrated circuitry disposed in the semiconductor layer laterally outside the photodiode structure, the integrated circuitry comprising transistors comprising second wells of the second conductivity type.

9. The semiconductor device according to claim 8, wherein the second wells of the second conductivity type have the same dopant concentration as the plurality of first wells of the photodiode structure.

10. The semiconductor device according to claim 8, wherein the first wells each comprise a first sub-region, with a higher dopant concentration than the first wells, the first sub-regions being formed at the main surface of the semiconductor, wherein the first wells are electrically connected to the regions of the second conductivity type via the first sub-regions by means of a first terminal that electrically connects the first wells and the at least one region of the second conductivity type, the first terminal being formed in the semiconductor at the main surface thereof, a second terminal connected to the semiconductor layer such that a depletion region of laterally varying distance to the main surface results from applying a reverse voltage to the first and second terminals.

11. The semiconductor device according to claim 8, wherein the first conductivity type is p-type.

12. The semiconductor device according to claim 8, wherein the photodiode structure and the integrated circuit are fabricated in a process flow according to CMOS technology materials, dimensions and process steps.

13. The semiconductor device according to claim 8, wherein the first wells extend from the main surface to a depth between 0.1 micrometers and 2.0 micrometers.

14. The semiconductor device according to claim 8, wherein the at least one region of the second conductivity type extends from the main surface to a depth between 0.05 micrometers and 0.5 micrometers.

15. A photodiode structure, comprising:
   a semiconductor of a first conductivity type, the semiconductor having a main surface;
   a first well formed in the semiconductor at the main surface thereof, the first well being of a second conductivity type opposite to the first conductivity type;
   a region of the second conductivity type having a higher dopant concentration than the first well, the region being formed in the semiconductor at the main surface thereof laterally outside the first well, wherein the region of the second conductivity type forms a pn junction with the semiconductor of the first conductivity type; and a first terminal electrically connecting the first well and the region of the second conductivity type.

16. The photodiode structure according to claim 15, wherein the region of the second conductivity type is formed in the semiconductor at the main surface thereof.

17. The photodiode structure according to claim 15, wherein the first conductivity type is p-type.

18. The photodiode structure according to claim 15, wherein the photodiode structure is formed on the same semiconductor substrate as laterally neighboring circuitry, the laterally neighboring circuitry comprising MOS transistors.

19. The photodiode structure according to claim 15, wherein the photodiode structure is fabricated in a process flow according to CMOS technology materials, dimensions and process steps.

20. The photodiode structure according to claim 15, wherein the first well extends from the main surface to a depth between 0.1 micrometers and 2.0 micrometers.

21. The photodiode structure according to claim 15, wherein the region of the second conductivity type extends from the main surface to a depth between 0.05 micrometers and 0.5 micrometers.

22. The photodiode structure according to claim 15, further comprising a second terminal connecting the semiconductor, wherein a depletion region of laterally varying distance to the main surface results from applying a reverse voltage to the first and second terminals.

23. The photodiode structure according to claim 15, comprising a second well formed in the semiconductor at the main surface laterally outside the first well, the second well being of the second conductivity type, wherein the first terminal connects the first well, said region and the second well.

24. The photodiode structure according to claim 23, wherein the first and second wells each comprise a sub-region, each sub-region having a higher dopant concentration than the first and second wells, the sub-regions being formed at the main surface of the semiconductor, wherein the first and second wells are electrically connected to the region of the second conductivity type via the sub-regions.

25. The photodiode structure according to claim 23, wherein the region of the second conductivity type vertically extends less from the main surface than the first and second wells.

26. The photodiode structure according to claim 23, wherein the first and the second well have the same dopant concentration.

27. The photodiode structure according to claim 23, wherein the semiconductor comprises a semiconductor substrate.

28. The photodiode structure according to claim 23, wherein the region of second conductivity type is spaced from both the first and second well regions.

* * * * *